United States Patent
Ko et al.

(10) Patent No.: US 10,847,473 B2
(45) Date of Patent: Nov. 24, 2020

(54) PRINTED CIRCUIT BOARDS WITH ANTI-WARPING MOLDING PORTIONS AND RELATED SEMICONDUCTOR PACKAGES AND METHODS OF FABRICATING

(71) Applicant: Samsung Electronics Co., Ltd., Suwon-si (KR)

(72) Inventors: Ji-Han Ko, Suwon-si (KR); Bo Ram Kang, Yongin-si (KR); Dong Kwan Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 10 days.

(21) Appl. No.: 16/052,117

(22) Filed: Aug. 1, 2018

(65) Prior Publication Data
US 2019/0122995 A1 Apr. 25, 2019

(30) Foreign Application Priority Data
Oct. 24, 2017 (KR) .......... 10-2017-0138134

(51) Int. Cl.
*H01L 23/552* (2006.01)
*H01L 23/31* (2006.01)
(Continued)

(52) U.S. Cl.
CPC .......... *H01L 23/552* (2013.01); *H01L 21/565* (2013.01); *H01L 23/295* (2013.01); *H01L 23/3128* (2013.01); *H01L 23/3135* (2013.01); *H01L 25/0657* (2013.01); *H01L 25/50* (2013.01); *H01L 21/561* (2013.01); *H01L 24/16* (2013.01); *H01L 24/32* (2013.01); *H01L 24/48* (2013.01); *H01L 24/73* (2013.01); *H01L 2224/0401* (2013.01); *H01L 2224/04042* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/97* (2013.01);
(Continued)

(58) Field of Classification Search
CPC ............... H01L 21/565; H01L 23/3135; H01L 25/0657
See application file for complete search history.

(56) References Cited

U.S. PATENT DOCUMENTS 7,148,126 B2 12/2006 Mita
7,502,231 B2 3/2009 Hwang et al.
(Continued)

FOREIGN PATENT DOCUMENTS

JP 2001015646 1/2001
JP 2005191051 7/2005
(Continued)

*Primary Examiner* — Stephen M Bradley
(74) *Attorney, Agent, or Firm* — Muir Patent Law, PLLC

(57) ABSTRACT

A semiconductor package can include a substrate and a semiconductor chip on the substrate. A first molding portion can cover the semiconductor chip and can include a first sidewall and a second sidewall opposite each other. A second molding portion can extend on the substrate along the first sidewall and along the second sidewall, where the first molding portion can include a nonconductive material, and the second molding portion can include a conductive material.

10 Claims, 19 Drawing Sheets

(51) Int. Cl.
   *H01L 21/56* (2006.01)
   *H01L 23/29* (2006.01)
   *H01L 25/065* (2006.01)
   *H01L 25/00* (2006.01)
   *H01L 23/00* (2006.01)

(52) U.S. Cl.
   CPC ........ *H01L 2225/0651* (2013.01); *H01L 2225/06517* (2013.01); *H01L 2225/06537* (2013.01); *H01L 2225/06555* (2013.01); *H01L 2225/06586* (2013.01); *H01L 2924/15311* (2013.01); *H01L 2924/181* (2013.01); *H01L 2924/3025* (2013.01)

(56) References Cited

U.S. PATENT DOCUMENTS

| | | | |
|---|---|---|---|
| 7,705,430 | B2 | 4/2010 | Sekiya |
| 2010/0013081 | A1* | 1/2010 | Toh ............... H01L 21/6835 257/692 |
| 2017/0135219 | A1 | 5/2017 | Hsu et al. |
| 2017/0170146 | A1* | 6/2017 | Shen ............. H01L 23/49816 |
| 2018/0010020 | A1* | 1/2018 | Furusho ............... C09J 11/06 |
| 2018/0166393 | A1* | 6/2018 | Han ................. H01L 23/552 |
| 2018/0323128 | A1* | 11/2018 | Dias ................ H01L 23/3128 |
| 2018/0358304 | A1* | 12/2018 | Hsu .................. H01L 23/562 |

FOREIGN PATENT DOCUMENTS

| | | |
|---|---|---|
| JP | 2012094562 | 5/2012 |
| KR | 20150042043 | 4/2015 |

\* cited by examiner

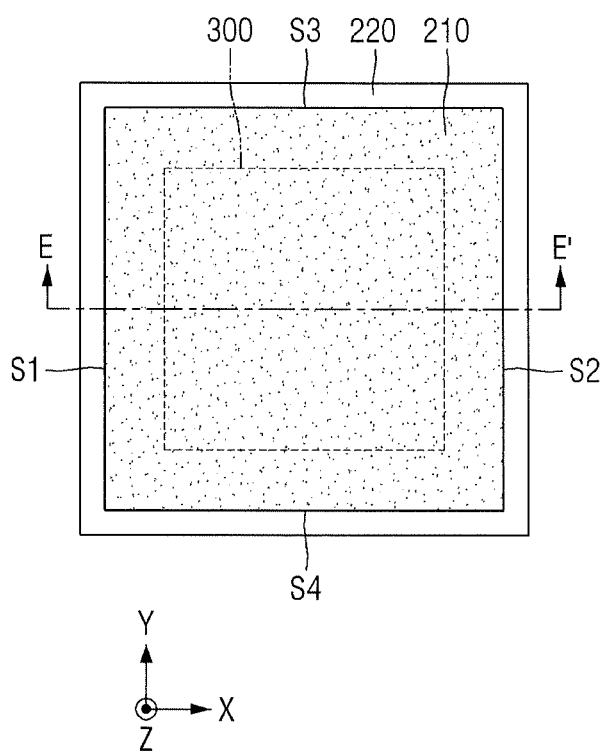

PRINTED CIRCUIT BOARDS WITH ANTI-WARPING MOLDING PORTIONS AND RELATED SEMICONDUCTOR PACKAGES AND METHODS OF FABRICATING

This application claims the benefit of Korean Patent Application No. 10-2017-0138134, filed on Oct. 24, 2017, in the Korean Intellectual Property Office, the disclosure of which is incorporated herein in its entirety by reference.

BACKGROUND

The present inventive concept relates to a printed circuit board (PCB), a semiconductor package, and a method of fabricating a semiconductor package. As mobile devices such as smartphones become smaller in size, lighter in weight and higher in performance, semiconductor packages may become thinner and more highly integrated. Accordingly, there is an increasing demand for thin substrates.

However, a thin substrate can cause a process defect. For example, due to reduced rigidity, a thin substrate can be warped or torn during the process of fabricating a semiconductor package. A jig or a carrier can be used to compensate for a decrease in the rigidity of the substrate. However, such a method may introduce new equipment and processes.

In addition, as semiconductor packages become thinner and more highly integrated, electromagnetic interference (EMI) may increases.

SUMMARY

In some embodiments, a semiconductor package can include a substrate and a semiconductor chip on the substrate. A first molding portion can cover the semiconductor chip and can include a first sidewall and a second sidewall opposite each other. A second molding portion can extend on the substrate along the first sidewall and along the second sidewall, where the first molding portion can include a nonconductive material, and the second molding portion can include a conductive material.

In some embodiments, a semiconductor package can include a substrate and a semiconductor chip on the substrate. A first molding portion can be on the substrate and can cover the semiconductor chip. A second molding portion can be on the substrate and can extend along sidewalls of the first molding portion. A third molding portion can cover an uppermost surface of the first molding portion and an uppermost surface of the second molding portion, where the second molding portion and the third molding portion can include a conductive epoxy molding compound.

In some embodiments, a printed circuit board (PCB) can include a substrate including a first mounting region and a second mounting region adjacent to each other along a first direction, where the first and second mounting regions are configured to mount integrated circuits thereon. A molding structure can be on the substrate and can include a conductive material, where the molding structure can include a peripheral portion which extends along edges of the substrate and a first bar which separates the first mounting region and the second mounting region.

BRIEF DESCRIPTION OF THE DRAWINGS

These and/or other aspects will become apparent and more readily appreciated from the following description of the embodiments, taken in conjunction with the accompanying drawings in which:

FIGS. 7A through 7C are schematic top views of semiconductor packages according to embodiments.

DETAILED DESCRIPTION

Printed circuit boards (PCBs) according to embodiments will now be described with reference to FIGS. 1 through 6.

Figure 1:
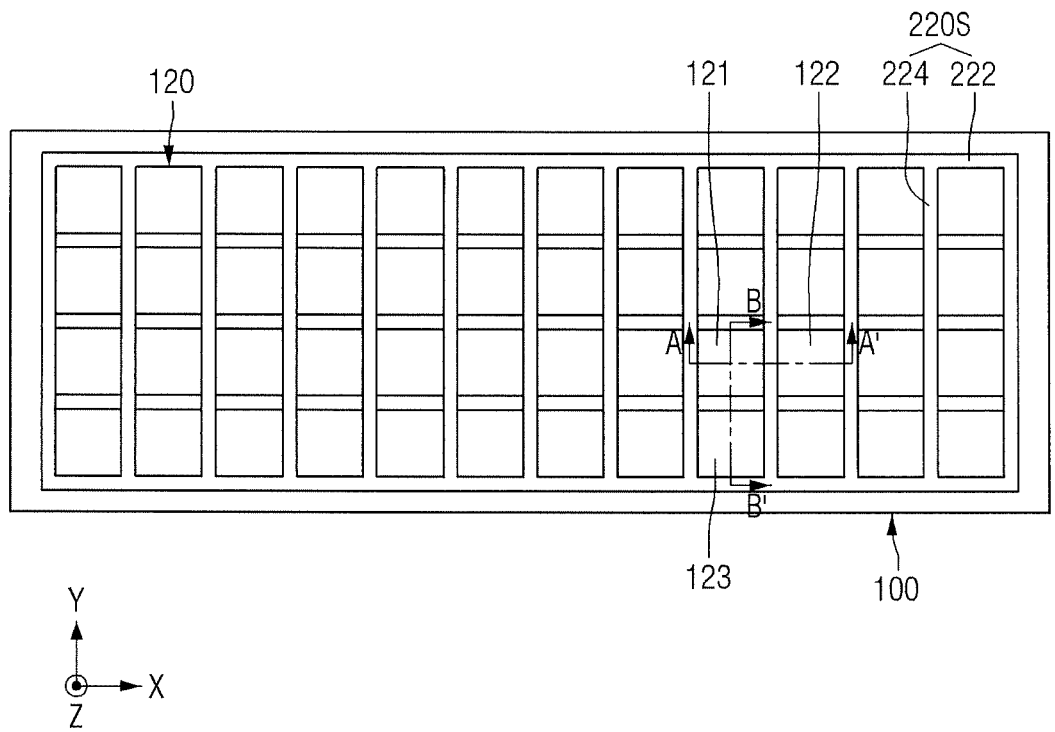
FIG. 1 is a schematic top view of a PCB according to embodiments.
Figure 2:
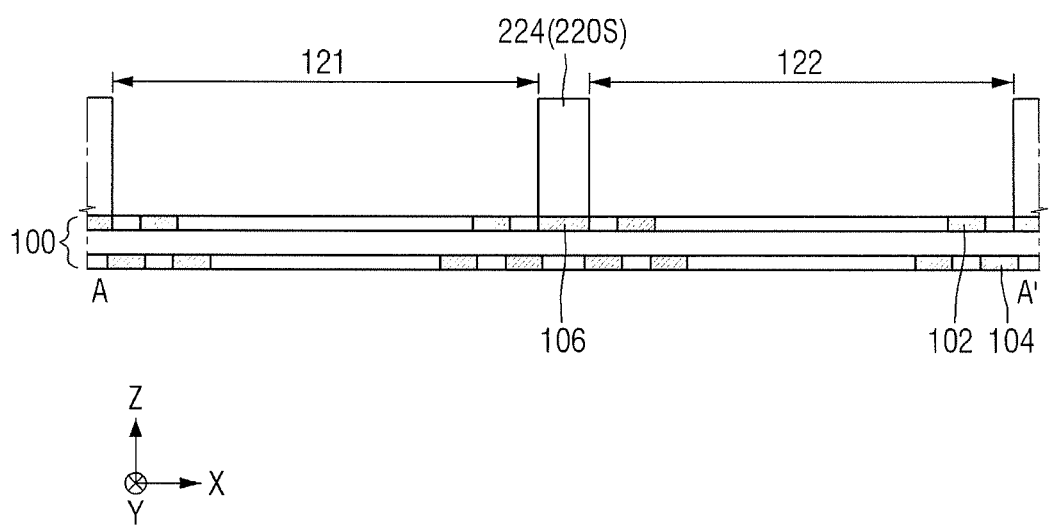
FIG. 2 is a schematic cross-sectional view taken along the line A-A' of FIG. 1.
Figure 3:
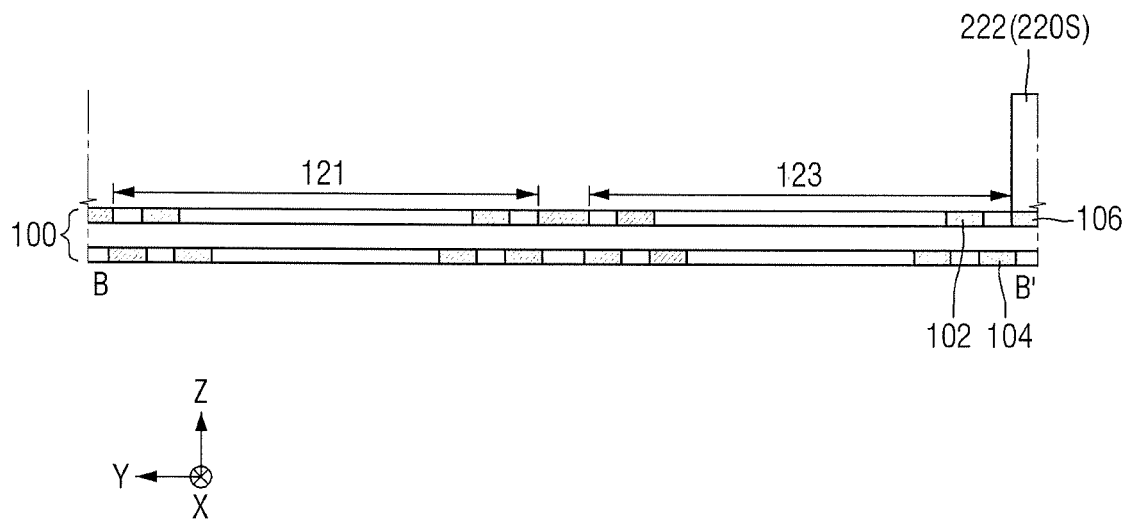
FIG. 3 is a schematic cross-sectional view taken along the line B-B' of FIG. 1.

FIG. 1 is a schematic top view of a PCB according to embodiments. FIG. 2 is a schematic cross-sectional view taken along the line A-A' of FIG. 1. FIG. 3 is a schematic cross-sectional view taken along the line B-B' of FIG. 1.

Referring to FIGS. 1 through 3, the PCB according to the embodiments includes a substrate 100 and a molding structure 220S.

The substrate 100 may be a substrate for packages. For example, the substrate 100 may be a thin PCB. The thickness of the substrate 100 may be, for example, 0.17 mm or less. The substrate 100 may be a single layer or a multilayer.

The substrate 100 may include a plurality of mounting regions 120. In FIG. 1, the mounting regions 120 are arranged in a checkerboard pattern. However, the present disclosure is not limited thereto.

Each of the mounting regions 120 may be a region in which a semiconductor chip 300 (see FIG. 8) can be mounted. For example, each of the mounting regions 120 may include a circuit pattern. The circuit pattern of each of the mounting regions 120 may be configured to electrically connect to the semiconductor chip 300.

The mounting regions 120 may include a first mounting region 121, a second mounting region 122, and a third mounting region 123 which are adjacent to each other.

For example, as illustrated in FIG. 1, the first mounting region 121 and the second mounting region 122 may be disposed adjacent to each other along a first direction X. However, the first mounting region 121 and the second mounting region 122 may be electrically separated from each other.

In addition, for example, as illustrated in FIG. 1, the first mounting region 121 and the third mounting region 123 may be disposed adjacent to each other along a second direction Y that intersects the first direction X. However, the first mounting region 121 and the third mounting region 123 may be electrically separated from each other.

In some embodiments, the third mounting region 123 may be an outermost mounting region among the mounting regions 120. For example, the third mounting region 123 may be a mounting region closest to an edge of the substrate 100 among the mounting regions 120.

In addition, the substrate 100 may include a first bonding pad 102, a second bonding pad 104, and a ground pad 106. Each of the first bonding pad 102, the second bonding pad 104, and the ground pad 106 may be one of a plurality of the same. In addition, the first bonding pads 102, the second bonding pads 104, and the ground pads 106 may each be formed as a conductor.

The first bonding pads 102 may be formed, for example, in an upper part of the substrate 100. The first bonding pads 102 may be connected to electrical circuits (such as circuit patterns) formed on the substrate 100. In addition, the first bonding pads 102 may be portions connected to bonding wires 306 (see FIG. 8) which will be described later. That is, the first bonding pads 102 may be portions by which the circuit patterns of the substrate 100 are connected to the outside. Accordingly, the substrate 100 may be electrically connected to for example, semiconductor chips by the first bonding pads 102.

The second bonding pads 104 may be formed, for example, in a lower part of the substrate 100. Like the first bonding pads 102, the second bonding pads 104 may be connected to electrical circuits (such as circuit patterns) formed on the substrate 100. In addition, the second bonding pads 104 may be portions connected to solder balls 110 (see FIG. 8) which will be described later. That is, the second bonding pads 104 may be portions by which the circuit patterns of the substrate 100 are connected to the outside.

The ground pads 106 may be formed, for example, in the upper part of the substrate 100. The ground pads 106 may be electrically connected to a ground line within the substrate 100. However, in some embodiments, the ground pads 106 may be omitted.

The molding structure 220S may be disposed on the substrate 100. The molding structure 220S may extend from an upper surface of the substrate 100 along a third direction Z intersecting the first direction X and the second direction Y.

The molding structure 220S according to the embodiments may include a peripheral portion 222 and a plurality of first bars 224.

The peripheral portion 222 of the molding structure 220S may extend along the edges of the substrate 100. For example, when the substrate 100 is rectangular, the peripheral portion 222 of the molding structure 220S may have a shape extending along the edges of the rectangular shape, as illustrated in FIG. 1.

In some embodiments, all of the mounting regions 120 may be disposed inside the peripheral portion 222. For example, the peripheral portion 222 of the molding structure 220S may extend along the periphery of outermost ones of the mounting regions 120. Accordingly, as illustrated in FIGS. 1 and 3, the peripheral portion 222 may be adjacent to the third mounting region 123 which is an outermost one of the mounting regions 120.

In some embodiments, some of the mounting regions 120 may be disposed outside the peripheral portion 222.

The first bars 224 of the molding structure 220S may separate at least some of the mounting regions 120. The first bars 224 of the molding structure 220S may extend inside the peripheral portion 222. For example, as illustrated in FIG. 1, the first bars 224 may extend along the second direction Y inside the peripheral portion 222 to separate at least some of the mounting regions 120. For example, as illustrated in FIGS. 1 and 2, a first bar 224 may separate the first mounting region 121 and the second mounting region 122 from each other.

The first bars 224 may be connected to the peripheral portion 222. In addition, the first bars 224 may extend from the peripheral portion 222 along the second direction Y. For example, the first bars 224 may be adjacent to all of the mounting regions 120 and extend along the second direction Y.

In some embodiments, the molding structure 220S may be spaced apart from the edges of the substrate 100. That is, the molding structure 220S may not be formed on the outermost periphery of the substrate 100. For example, as illustrated in FIG. 1, the edges of the peripheral portion 222 of the molding structure 220S may be spaced apart from the edges of the substrate 100.

In some embodiments, the molding structure 220S may contact the ground pads 106. For example, as illustrated in FIGS. 2 and 3, the peripheral portion 222 and the first bars 224 may be formed on the ground pads 106. Accordingly, the ground pads 106 may provide a ground voltage to the molding structure 220S. In FIG. 2, the width of the ground pads 106 is equal to the width of the first bars 224. However, the present disclosure is not limited thereto. For example, the width of the ground pads 106 may be larger or smaller than the width of the first bars 224.

The molding structure 220S may include, but is not limited to, an epoxy molding compound (EMC).

In some embodiments, the molding structure 220S may include a conductive material. For example, the molding structure 220S may include a conductive EMC. The conductive EMC may include a conductive filler. The conductive filler may include, for example, ferrite. However, the conductive filler can include various known conductive fillers. For example, the conductive filler may include at least one of metal-based conductive fillers including Ag, Cu, Ni, ZnO, $SnO_2$, Al and stainless steel, carbon-based conductive fillers including acetylene black, channel black, pitch-/pan-based carbon fibers and graphite, polymer-based conductive fillers including polyaniline, polypyrrole and polythiophene, and combinations of these fillers.

In some embodiments, the molding structure 220S may include 50% or more by weight of the conductive filler based on 100% by weight of the conductive EMC. For example, the molding structure 220S may include 85 to 95% by weight of the conductive filler based on 100% by weight of the conductive EMC. In still further embodiments, the molding structure 220S may include a conductive material in such an amount to provide sufficient EMI shielding to an integrated circuit within the semiconductor package.

As appreciated by the present inventors, a thin substrate can cause a process defect. For example, due to reduced rigidity, a thin substrate can be warped or torn during the process of fabricating a semiconductor package. However, the PCB according to the embodiments can reinforce the rigidity of the substrate by using the molding structure 220S. For example, in an assembling or transferring process, the molding structure 220S may support the substrate 100 to reinforce the rigidity of the substrate 100.

A jig or a carrier can be used to compensate for a decrease in the rigidity of a substrate. However, such a method may introduce new equipment and processes. On the other hand, since the molding structure 220S according to the embodiments includes an EMC, the existing equipment and processes can be used without tearing or warping of the thin substrate. For example, the molding structure 220S according to the embodiments can be manufactured using the same equipment as the equipment for manufacturing a first molding portion 210 (see FIG. 8). Therefore, the PCB according to the embodiments can reduce the manufacturing cost of semiconductor packages.

In addition, since the molding structure 220S according to the embodiments is spaced apart from the edges of the substrate 100, a region for handling the substrate 100 can be provided. For example, a jig used in the process of fabricating a semiconductor package can fix the PCB according to the embodiments by using the edges of the substrate 100 on which the molding structure 220S is not formed.

Figure 4:
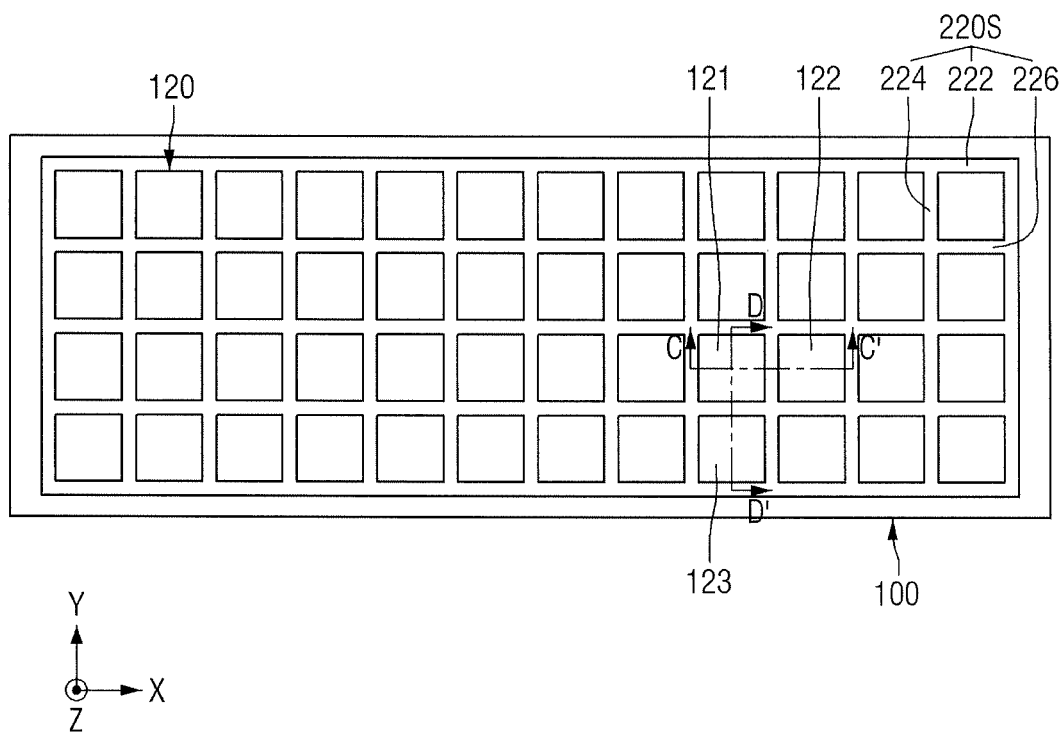
FIG. 4 is a schematic top view of a PCB according to embodiments.
Figure 5:
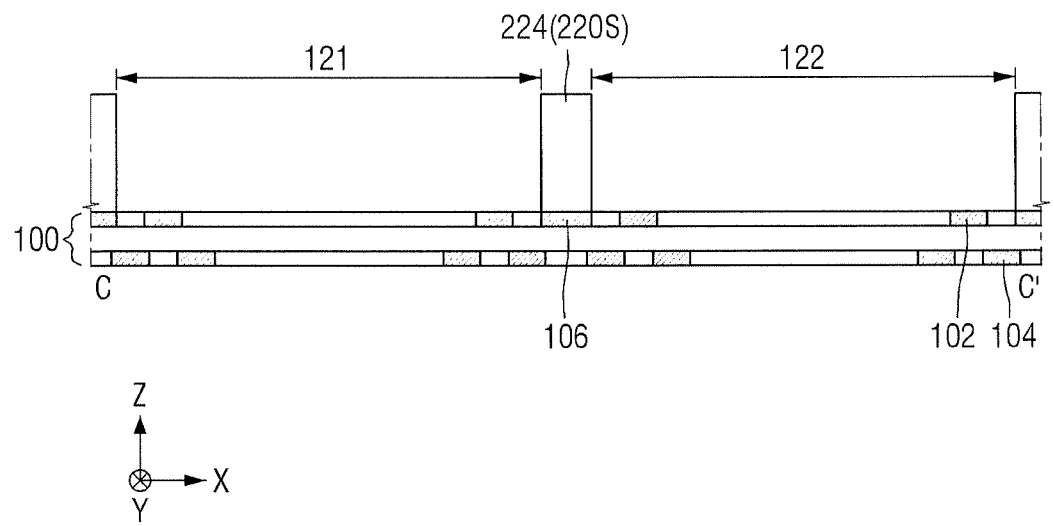
FIG. 5 is a schematic cross-sectional view taken along the line C-C' of FIG. 4.
Figure 6:
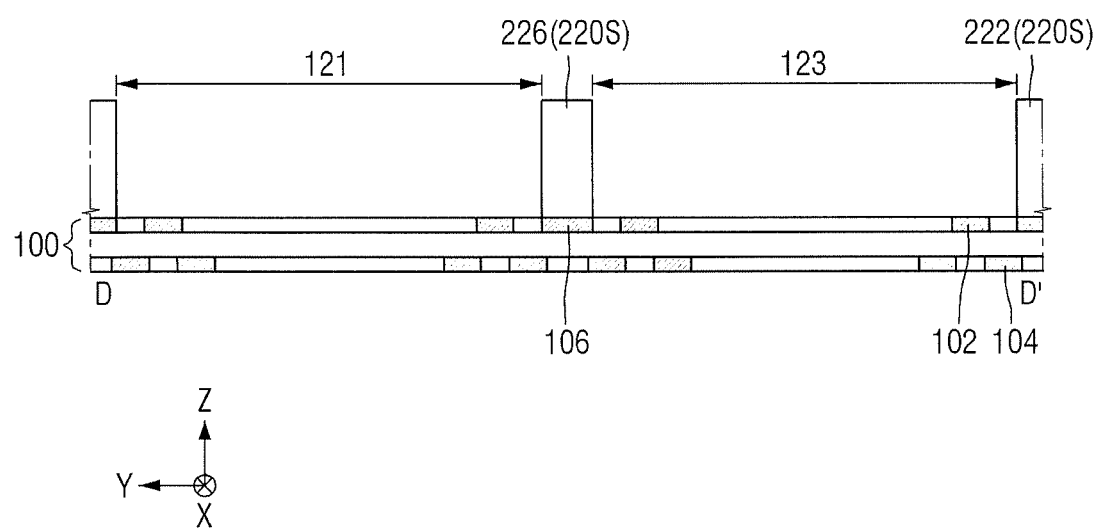
FIG. 6 is a schematic cross-sectional view taken along the line D-D' of FIG. 4.

FIG. 4 is a schematic top view of a PCB according to embodiments. FIG. 5 is a schematic cross-sectional view taken along the line C-C' of FIG. 4. FIG. 6 is a schematic cross-sectional view taken along the line D-D' of FIG. 4. For ease of description, a description of elements identical to those described above with reference to FIGS. 1 through 3 will be given briefly or may be omitted.

Referring to FIGS. 4 through 6, a molding structure 220S according to embodiments further includes a plurality of second bars 226.

The second bars 226 of the molding structure 220S may separate at least some of a plurality of mounting regions 120. The second bars 226 of the molding structure 220S may extend inside a peripheral portion 222. For example, as illustrated in FIG. 4, the second bars 226 extend along the first direction X inside the peripheral portion 222 to separate at least some of the mounting regions 120. For example, as illustrated in FIGS. 4 and 6, a second bar 226 may separate a first mounting region 121 and a third mounting region 123 from each other.

The second bars 226 may be connected to the peripheral portion 222. The second bars 226 may extend from the peripheral portion 222 along the first direction X. For example, the second bars 226 may be adjacent to all of the mounting regions 120 and extend along the first direction X.

Since the mounting regions 120 can be arranged in a checkerboard pattern, the molding structure 220S may be formed, for example, in a lattice pattern. Accordingly, the mounting regions 120 may be separated from each other by the molding structure 220S.

In some embodiments, the molding structure 220S may contact ground pads 106. For example, as illustrated in FIGS. 5 and 6, the peripheral portion 222, first bars 224, and the second bars 226 may be formed on the ground pads 106. Accordingly, the ground pads 106 may provide a ground voltage to the molding structure 220S. In FIG. 6, the width of the ground pads 106 is equal to the width of the second bars 226. However, the present disclosure is not limited thereto. For example, the width of the ground pads 106 may be larger or smaller than the width of the second bars 226.

Semiconductor packages according to embodiments will now be described with reference to FIGS. 7A through 13.

Figure 7A:
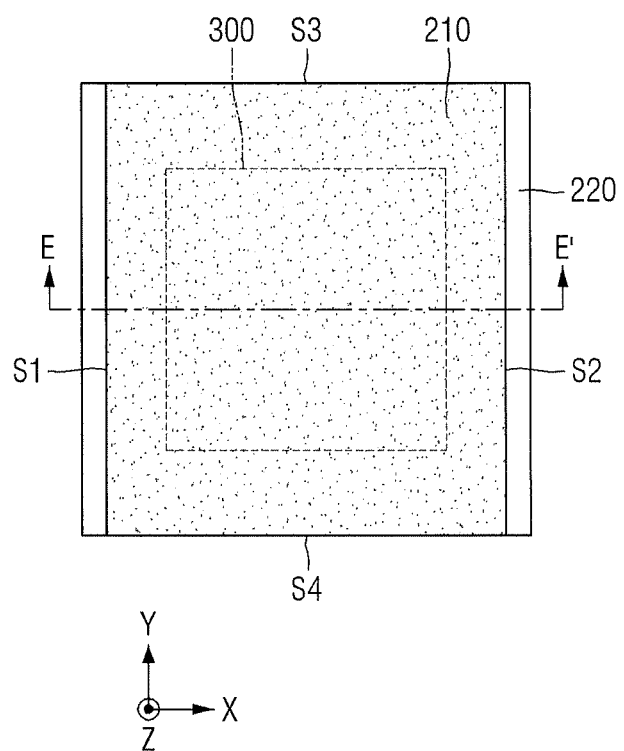
Figure 7B:
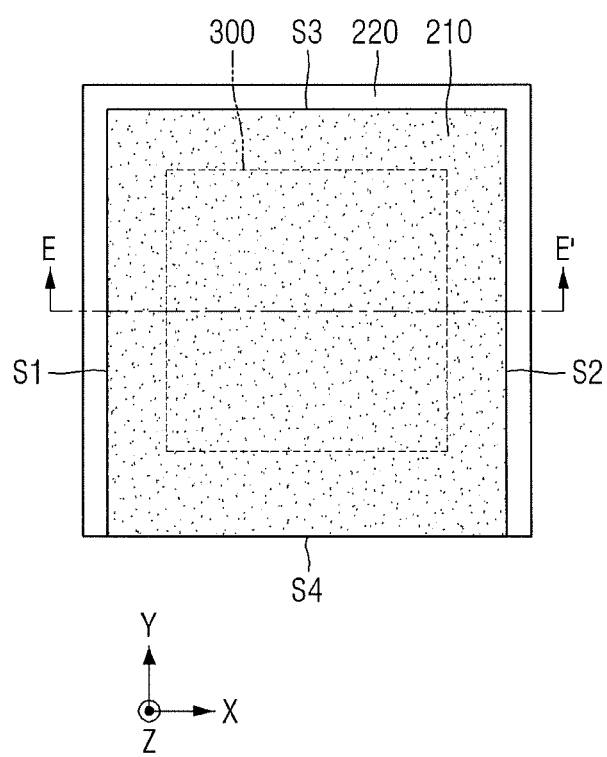
Figure 8:
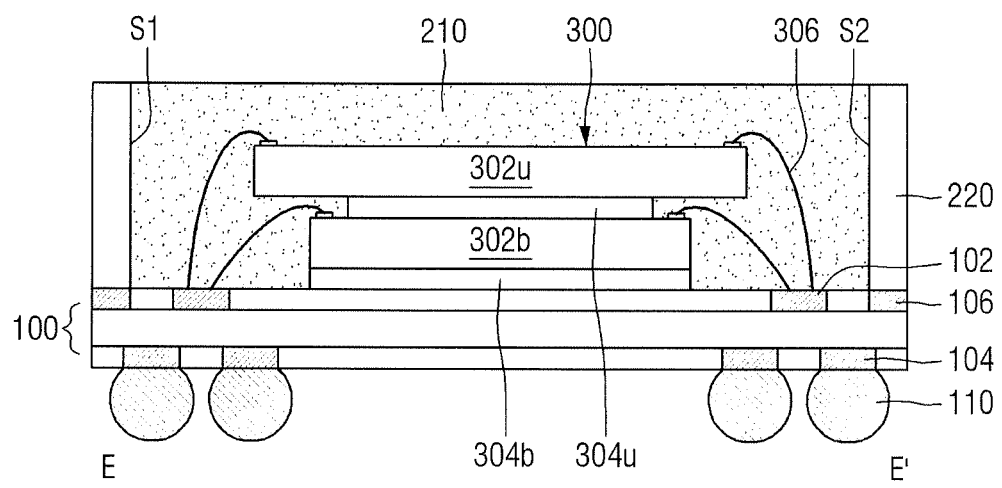
FIG. 8 is a schematic cross-sectional view taken along the line E-E' of FIG. 7A.

FIGS. 7A through 7C are various schematic top views of semiconductor packages according to embodiments. FIG. 8 is a schematic cross-sectional view taken along the line E-E' of FIG. 7A. For ease of description, a description of elements identical to those described above with reference to FIGS. 1 through 6 will be given briefly or may be omitted.

Referring to FIGS. 7A and 8, a semiconductor package according to embodiments includes a substrate 100, a semiconductor chip 300, bonding wires 306, solder balls 110, a first molding portion 210, and a second molding portion 220.

The semiconductor chip 300 may be disposed on the substrate 100. For example, the semiconductor chip 300 may be mounted on a mounting region 120 (see FIG. 1) of the substrate 100. The semiconductor chip 300 may be, but is not limited to, a logic device such as a microprocessor.

The semiconductor chip 300 may have a structure in which a plurality of chips are stacked. For example, the semiconductor chip 300 may include a lower chip 302b and an upper chip 302u stacked on the lower chip 302b. While a structure in which only two chips are stacked is illustrated in FIG. 8, the semiconductor chip 300 can have a structure in which three or more chips are stacked.

The lower chip 302b may be mounted on the substrate 100 by a lower attachment portion 304b. The lower attachment portion 304b may mount the lower chip 302b on the substrate 100 by using an adhesive medium.

The upper chip 302u may be mounted on the lower chip 302b by an upper attachment portion 304u. Like the lower attachment portion 304b, the upper attachment portion 304u may mount the upper chip 302u on the lower chip 302b by using an adhesive medium.

Each of the lower attachment portion 304b and the upper attachment portion 304u may include, but is not limited to, a liquid epoxy, an adhesive tape, or a conductive medium.

In some embodiments, the semiconductor chip 300 may be mounted on the substrate 100 by flip-chip bonding. Although not illustrated in the drawings, for example, a plurality of conductive chip bumps may be interposed between the substrate 100 and the semiconductor chip 300. The conductive chip bumps may be formed by, e.g., a soldering process.

The bonding wires 306 may electrically connect the substrate 100 and the semiconductor chip 300. For example, the bonding wires 306 may be connected to first bonding pads 102 of the substrate 100. However, the substrate 100 can also be electrically connected to the semiconductor chip 300 by, e.g., a bonding tape.

The solder balls 110 may be connected to the substrate 100. For example, the solder balls 110 may be connected to second bonding pads 104 of the substrate 100. Accordingly, the substrate 100 may be electrically connected to another substrate or the like by the solder balls 110. For example, the substrate 100 may be electrically connected to a module board or a main circuit board by the solder balls 110.

The first molding portion 210 may cover the semiconductor chip 300. Accordingly, the semiconductor chip 300 may be sealed by the first molding portion 210.

The first molding portion 210 may include a first sidewall S1, a second sidewall S2, a third sidewall S3, and a fourth sidewall S4. The first sidewall S1 and the second sidewall S2 may be opposite sidewalls of the first molding portion 210. The third sidewall S3 of the first molding portion 210 may be a sidewall connecting the first sidewall S1 and the second sidewall S2. The fourth sidewall S4 of the first molding portion 210 may be a sidewall facing the third sidewall S3.

For example, the first sidewall S1 and the second sidewall S2 may be both sidewalls of the first molding portion 210 which extend along the second direction Y. The third sidewall S3 may be a sidewall of the first molding portion 210 which extends along the first direction X. The fourth sidewall S4 may be another sidewall of the first molding portion 210 which extends along the first direction X. For example, the first sidewall S1, the second sidewall S2, the third sidewall S3 and the fourth sidewall S4 may be sidewalls of the first molding portion 210 shaped like a rectangular parallelepiped.

The first molding portion 210 may include a nonconductive material. The first molding portion 210 may include, for example, a nonconductive EMC including a nonconductive filler. The nonconductive filler may include, but is not limited to, silica.

The second molding portion 220 may extend on the substrate 100 along at least some of the sidewalls of the first molding portion 210. Accordingly, the second molding portion 220 may surround at least part of the semiconductor chip 300. For example, as illustrated in FIG. 7A, the second molding portion 220 may extend along the first sidewall S1 and the second sidewall S2 of the first molding portion 210. However, in some embodiments, the second molding portion 220 may not extend along the third sidewall S3 and the fourth sidewall S4 of the first molding portion 210.

As illustrated in FIG. 8, a lower surface of the second molding portion 220 may contact an upper surface of the substrate 100. In FIG. 8, the upper surface of the second molding portion 220 lies in the same plane with an upper surface of the first molding portion 210. However, the present disclosure is not limited thereto. For example, the upper surface of the second molding portion 220 may be higher or lower than the upper surface of the first molding portion 210.

In some embodiments, the second molding portion 220 may contact ground pads 106 of the substrate 100. Accordingly, the second molding portion 220 may be grounded by the ground pads 106.

A semiconductor package according to embodiments may be a semiconductor package fabricated using one of the PCBs of FIGS. 1 through 6. For example, a plurality of semiconductor packages adjacent to each other may be fabricated using one of the PCBs of FIGS. 1 through 6. Then, the semiconductor packages adjacent to each other may be cut to produce the semiconductor packages of FIGS. 7A through 8, and as described in further detail with reference to FIGS. 14 through 25.

For example, the semiconductor package of FIGS. 7A and 8 may be fabricated using the PCB of FIGS. 1 through 3. In this case, the second molding portion 220 may be part of the molding structure 220S of FIG. 1. For example, the second molding portion 220 on each of the first sidewall S1 and the second sidewall S2 may be part of a first bar 224.

Referring to FIGS. 7B and 8, a second molding portion 220 according to embodiments may further extend along the third sidewall S3.

For example, as illustrated in FIG. 7B, the second molding portion 220 may extend along the first sidewall S1, the second sidewall S2 and the third sidewall S3 of the first molding portion 210. However, in some embodiments, the second molding portion 220 may not extend along the fourth sidewall S4 of the first molding portion 210.

A semiconductor package according to embodiments may be a semiconductor package fabricated using one of the PCBs of FIGS. 1 through 6.

For example, the semiconductor package of FIGS. 7B and 8 may be fabricated using the PCB of FIGS. 1 through 3. In this case, the second molding portion 220 may be part of the molding structure 220S of FIG. 1. For example, the second molding portion 220 on each of the first sidewalls and the second sidewall S2 may be part of a first bar 224. For example, the second molding portion 220 on the third sidewall S3 may be part of a peripheral portion 222.

Referring to FIGS. 7C and 8, a second molding portion 220 according to embodiments may further extend along the fourth sidewall S4.

For example, as illustrated in FIG. 7C, the second molding portion 220 may extend along the first sidewall S1, the second sidewall S2, the third sidewall S3 and the fourth sidewall S2 of the first molding portion 210.

A semiconductor package according to embodiments may be a semiconductor package fabricated using one of the PCBs of FIGS. 1 through 6.

For example, the semiconductor package of FIGS. 7C and 8 may be fabricated using the PCB of FIGS. 4 through 6. In this case, the second molding portion 220 may be part of the molding structure 220S of FIG. 1. For example, the second molding portion 220 on each of the first sidewall S1 and the second sidewall S2 may be part of a first bar 224. For example, the second molding portion 220 on each of the third sidewall S3 and the fourth sidewall S4 may be part of a second bar 226. Alternatively, the second molding portion 220 on the first sidewall S1, the second sidewall S2, the third sidewall S3 or the fourth sidewall S4 may be part of the peripheral portion 222.

Figure 9:
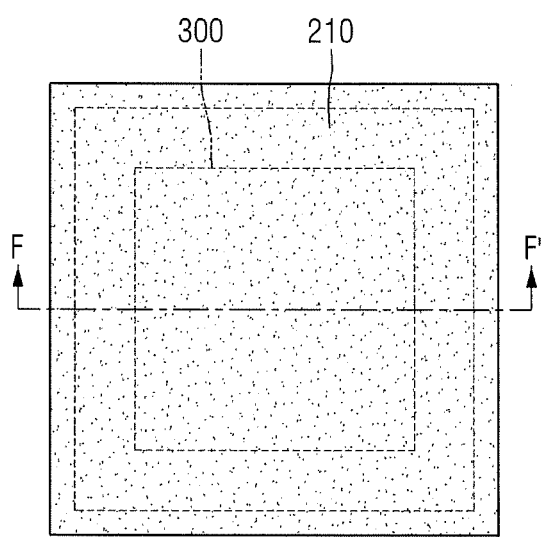
FIG. 9 is a schematic top view of a semiconductor package according to embodiments.
Figure 10:
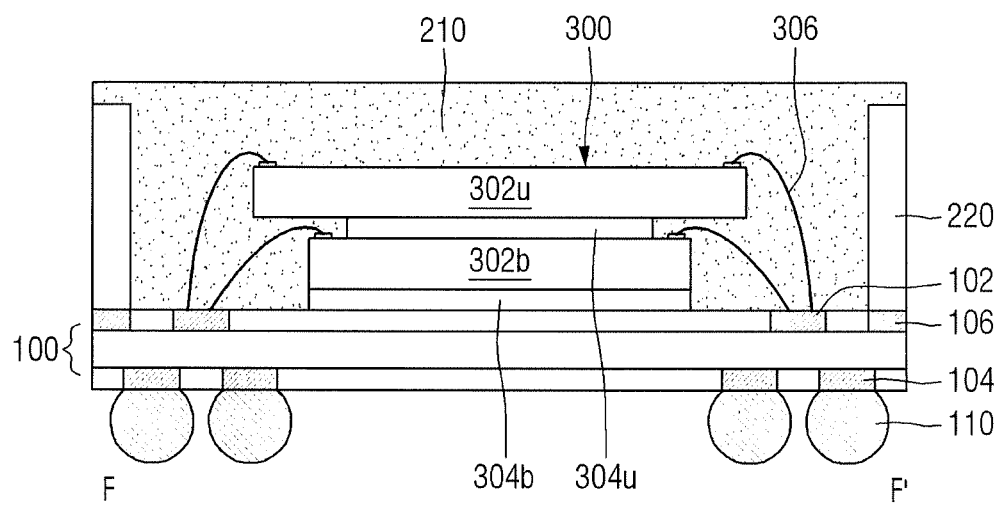
FIG. 10 is a schematic cross-sectional view taken along the line F-F' of FIG. 9.

FIG. 9 is a schematic top view of a semiconductor package according to embodiments. FIG. 10 is a schematic cross-sectional view taken along the line F-F' of FIG. 9. For ease of description, a description of elements identical to those described above with reference to FIGS. 1 through 8 will be given briefly or may be omitted.

Referring to FIGS. 9 and 10, a first molding portion 210 according to embodiments may cover an upper surface of a second molding portion 220. For example, an uppermost surface of the first molding portion 210 may be higher than an uppermost surface of the second molding portion 220.

In FIGS. 9 and 10, the first molding portion 210 covers the entire upper surface of the second molding portion 220. However, the present disclosure is not limited thereto. For example, the first molding portion 210 may cover part of the upper surface of the second molding portion 220.

Figure 11:
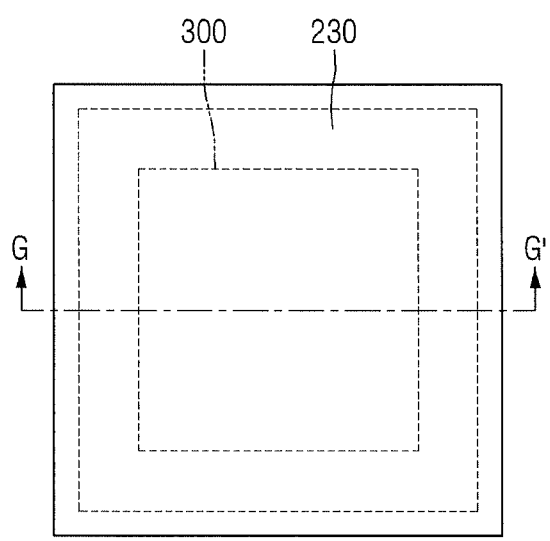
FIG. 11 is a schematic top view of a semiconductor package according to embodiments.
Figure 12:
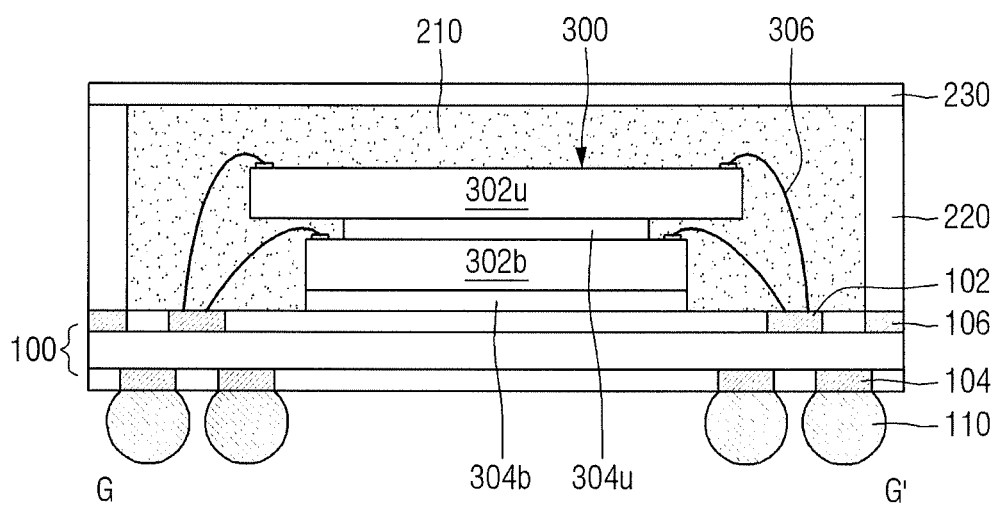
FIG. 12 is a schematic cross-sectional view taken along the line G-G' of FIG. 11.
Figure 12:
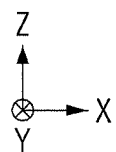

FIG. 11 is a schematic top view of a semiconductor package according to embodiments. FIG. 12 is a schematic cross-sectional view taken along the line G-G' of FIG. 11. For ease of description, a description of elements identical to those described above with reference to FIGS. 1 through 8 will be given briefly or may be omitted.

Referring to FIGS. 11 and 12, the semiconductor package according to the embodiments further includes a third molding portion 230.

The third molding portion 230 may be disposed on a first molding portion 210 and a second molding portion 220. Accordingly, the third molding portion 230 may contact the second molding portion 220. When the second molding portion 220 is grounded as described above, the third molding portion 230 may also be grounded.

In FIGS. 11 and 12, the third molding portion 230 completely covers an upper surface of the first molding portion 210 and an upper surface of the second molding portion 220. However, the present disclosure is limited thereto. For example, the third molding portion 230 may cover part of the upper surface of the second molding portion 220. However, the third molding portion 230 may completely cover the upper surface of the first molding portion 210.

The third molding portion 230 may include, but is not limited to, an EMC.

In some embodiments, the third molding portion 230 may include a conductive material. For example, the third molding portion 230 may include a conductive EMC. The conductive EMC may include a conductive filler. The conductive filler may include, for example, ferrite. However, the conductive filler can include various known conductive fillers. For example, the conductive filler may include at least one of metal-based conductive fillers including Ag, Cu, Ni, ZnO, SnO$_2$, Al and stainless steel, carbon-based conductive fillers including acetylene black, channel black, pitch-/pan-based carbon fibers and graphite, polymer-based conductive fillers including polyaniline, polypyrrole and polythiophene, and combinations of these fillers.

In some embodiments, the third molding portion 230 may include 50% or more by weight of the conductive filler based on 100% by weight of the conductive EMC. For example, the third molding portion 230 may include 85 to 95% by weight of the conductive filler based on 100% by weight of the conductive EMC.

In some embodiments, the third molding portion 230 may include the same material as the second molding portion 220. For example, the third molding portion 230 may include a conductive filler of a type different from that of the conductive filler of the second molding portion 220 or may include a different content of conductive filler from the second molding portion 220.

Figure 13:
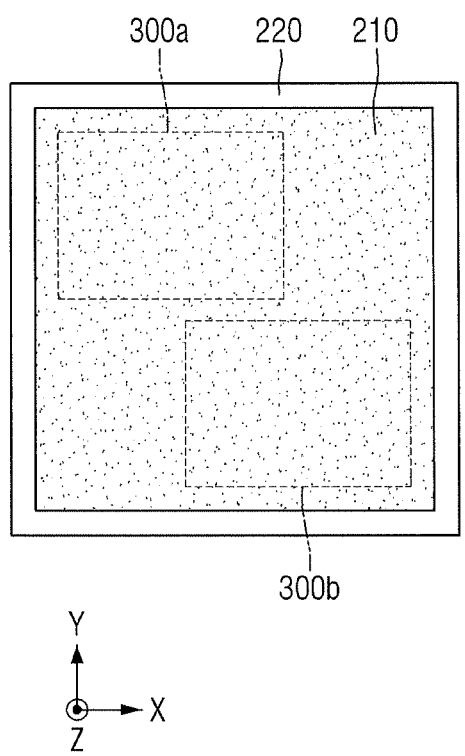
FIG. 13 is a schematic top view of a semiconductor package according to embodiments.

FIG. 13 is a schematic top view of a semiconductor package according to embodiments. For ease of description, a description of elements identical to those described above with reference to FIGS. 1 through 8 will be given briefly or may be omitted.

Referring to FIG. 13, the semiconductor package according to the embodiments may include a plurality of sub-semiconductor chips.

For example, a first sub-semiconductor chip 300a and a second sub-semiconductor chip 300b may be disposed on a substrate 100. Each of the first sub-semiconductor chip 300a and the second sub-semiconductor chip 300b may correspond to the semiconductor chip 300 of FIGS. 7A through 8.

A first molding portion 210 may cover the first sub-semiconductor chip 300a and the second sub-semiconductor chip 300b. Accordingly, the first sub-semiconductor chip 300a and the second sub-semiconductor chip 300b may be sealed by the first molding portion 210. A second molding portion 220 may surround at least part of the first sub-semiconductor chip 300a and the second sub-semiconductor chip 300b.

As semiconductor packages become thinner and more highly integrated, the rigidity of the semiconductor packages may be reduced. For example, as semiconductor packages become thinner, the warpage of the semiconductor packages may be increased. However, the rigidity of a semiconductor package according to embodiments can be reinforced using the second molding portion 220. For example, the second molding portion 220 may support the substrate 100 and the first molding portion 210 to reinforce the rigidity of the semiconductor package according to the embodiments.

Further, as semiconductor packages become thinner and more highly integrated, electromagnetic interference (EMI) may become worse. However, a semiconductor package according to embodiments can prevent EMI by using the second molding portion 220. For example, the second molding portion 220 including a conductive material may be grounded by being in contact with the ground pads 106 of the substrate 100. The grounded second molding portion 220 may surround the semiconductor chip 300 and reduce EMI effects on the semiconductor chip 300.

In some embodiments, the grounded third molding portion 230 may completely surround the semiconductor chip 300 together with the second molding portion 220 and minimize the effect of EMI on the semiconductor chip 300.

A method of fabricating a semiconductor package according to embodiments will now be described with reference to FIGS. 14 through 25.

FIGS. 14 through 25 are views illustrating steps of a method of fabricating a semiconductor package according to embodiments. For ease of description, a description of elements identical to those described above with reference to FIGS. 1 through 13 will be given briefly or may be omitted.

Figure 14:
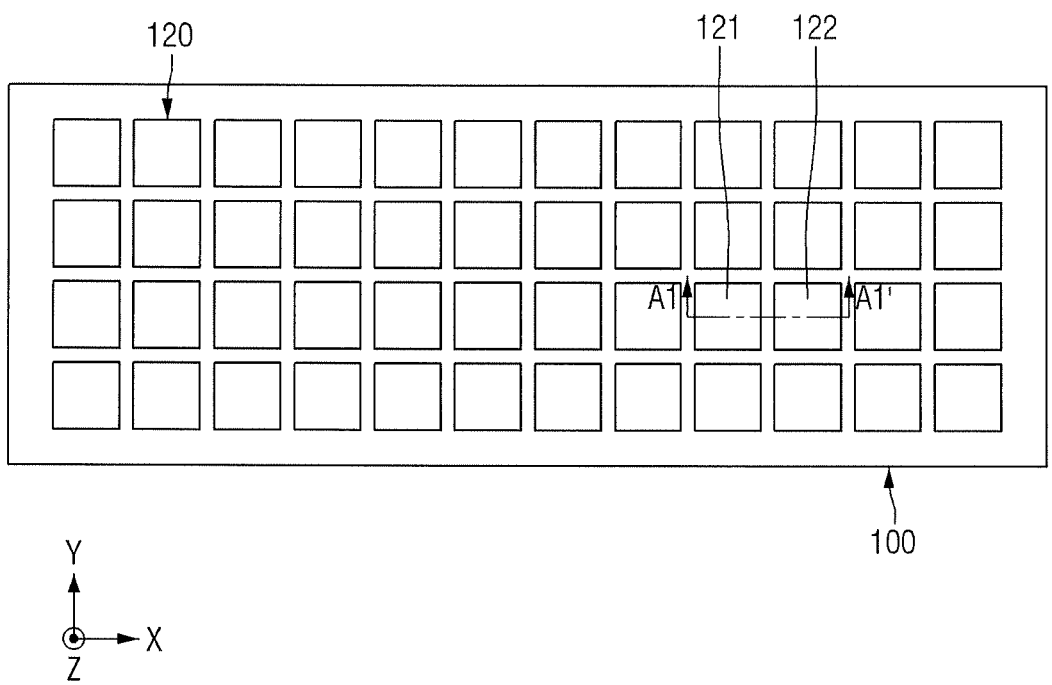
FIGS. 14 through 25 are views illustrating a method of fabricating a semiconductor package according to embodiments.
Figure 15:
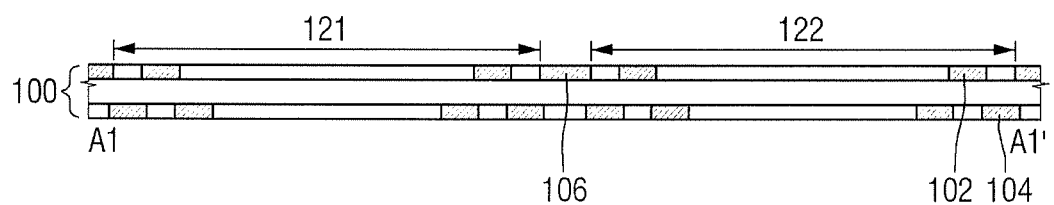

Referring to FIGS. 14 and 15, a substrate 100 including a plurality of mounting regions 120 is provided. For reference, FIG. 15 is a cross-sectional view taken along the line A1-A1' of FIG. 14.

The mounting regions 120 may include a first mounting region 121 and a second mounting region 122 adjacent to each other along the first direction X.

The substrate 100 may include a first bonding pad 102, a second bonding pad 104, and a ground pad 106. Each of the first bonding pad 102, the second bonding pad 104, and the ground pad 106 may be formed in plural numbers. In addition, the first bonding pads 102, the second bonding pads 104, and the ground pads 106 may each be formed as a conductor.

Figure 16A:
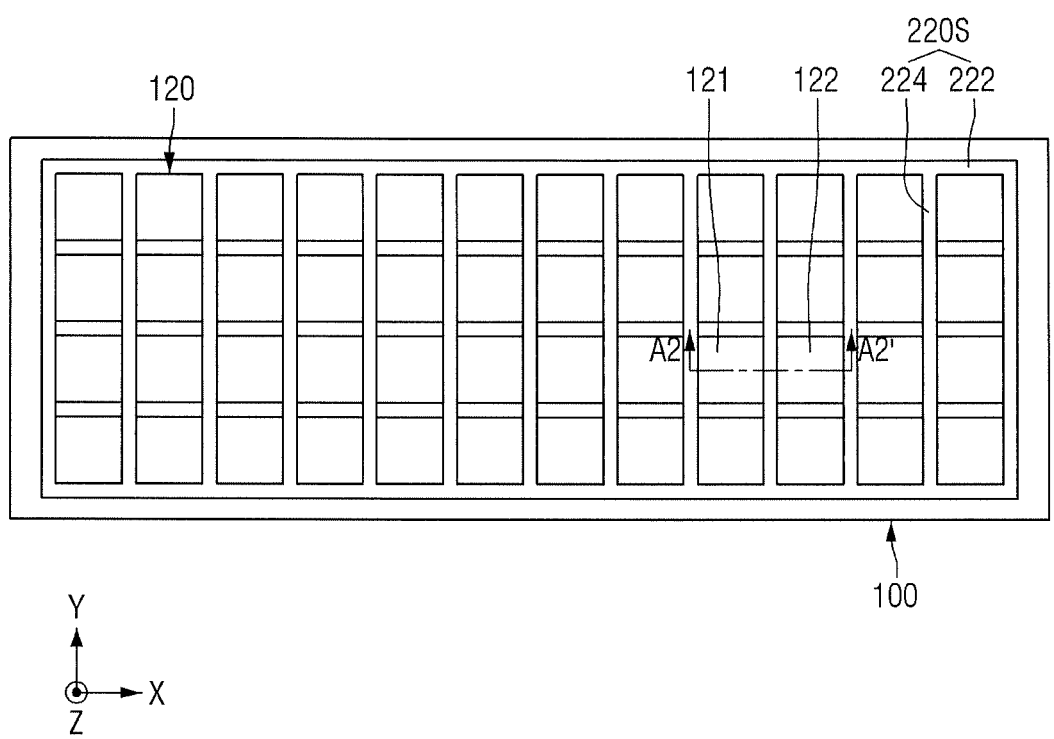
Figure 16B:
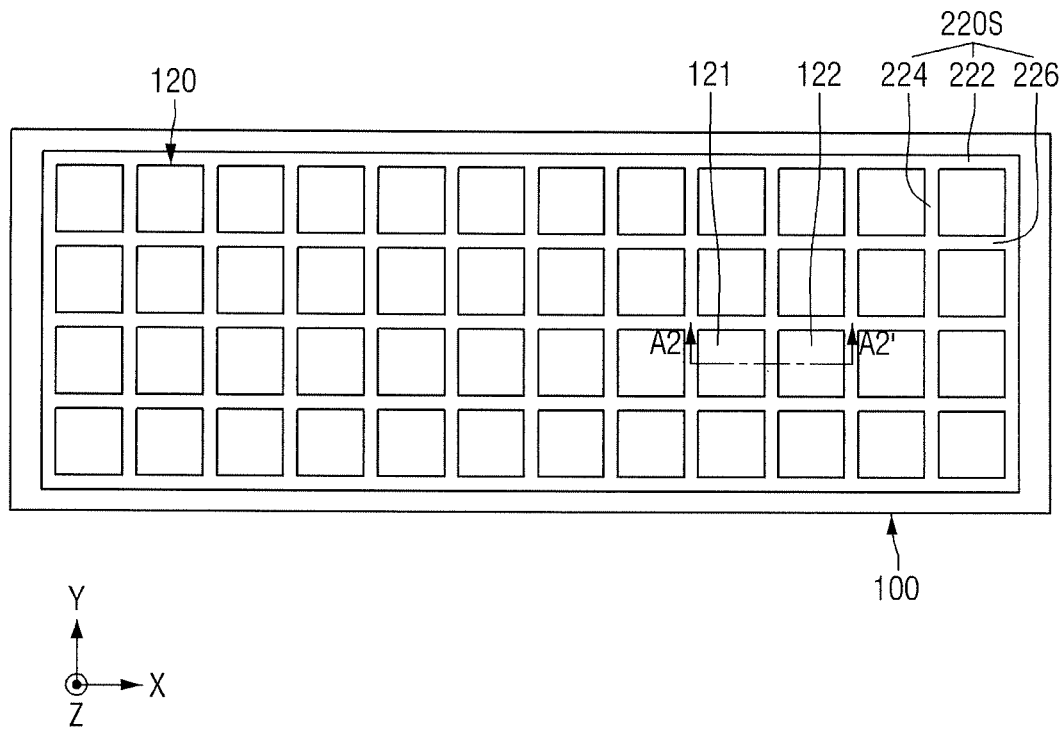
Figure 17:
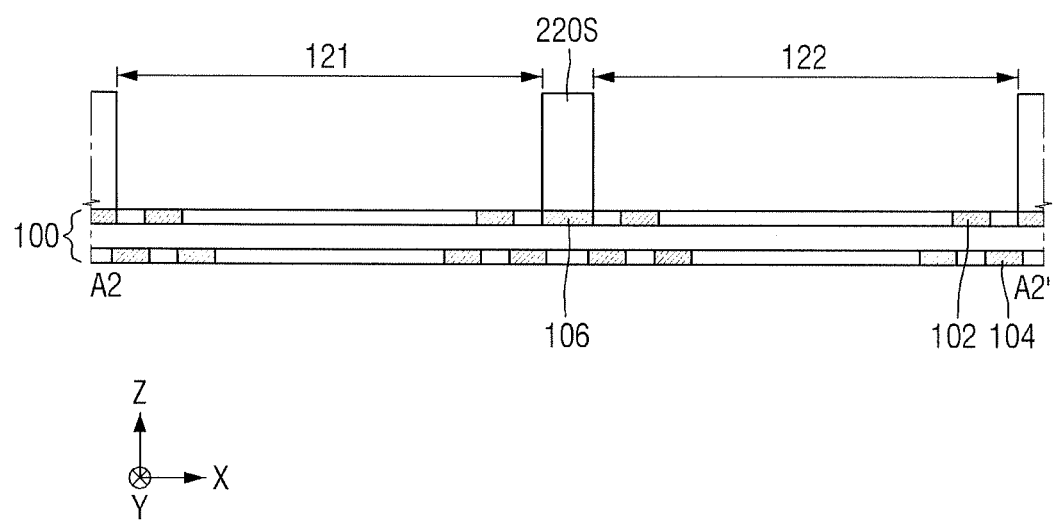

Referring to FIGS. 16A through 17, a molding structure 220S is formed on the substrate 100. For reference, FIG. 17 is a cross-sectional view taken along the line A2-A2' of FIGS. 16A and 16B.

The molding structure 220S may be formed in various shapes. For example, as illustrated in FIG. 16A, a molding structure 220S including a peripheral portion 222 and first bars 224 may be formed. Accordingly, the PCB of FIGS. 1 through 3 may be manufactured.

Alternatively, as illustrated in FIG. 16B, a molding structure 220S including a peripheral portion 222, first bars 224, and second bars 226 may be formed. Accordingly, the PCB of FIGS. 4 through 6 may be manufactured.

For ease of description, the molding structure 220S will be described below as including the peripheral portion 222, the first bars 224 and the second bars 226.

The molding structure 220S may include, for example, an EMC. The molding structure 220S may be formed by at least one of, for example, dispensing, film attach, transfer molding, and compression molding. However, the molding structure 220S can also be formed by various methods of forming a mold including an EMC.

In some embodiments, the molding structure 220S may include a conductive material. For example, the molding structure 220S may include a conductive EMC.

In some embodiments, the molding structure 220S may be formed to contact the ground pads 106 of the substrate 100.

Figure 18:
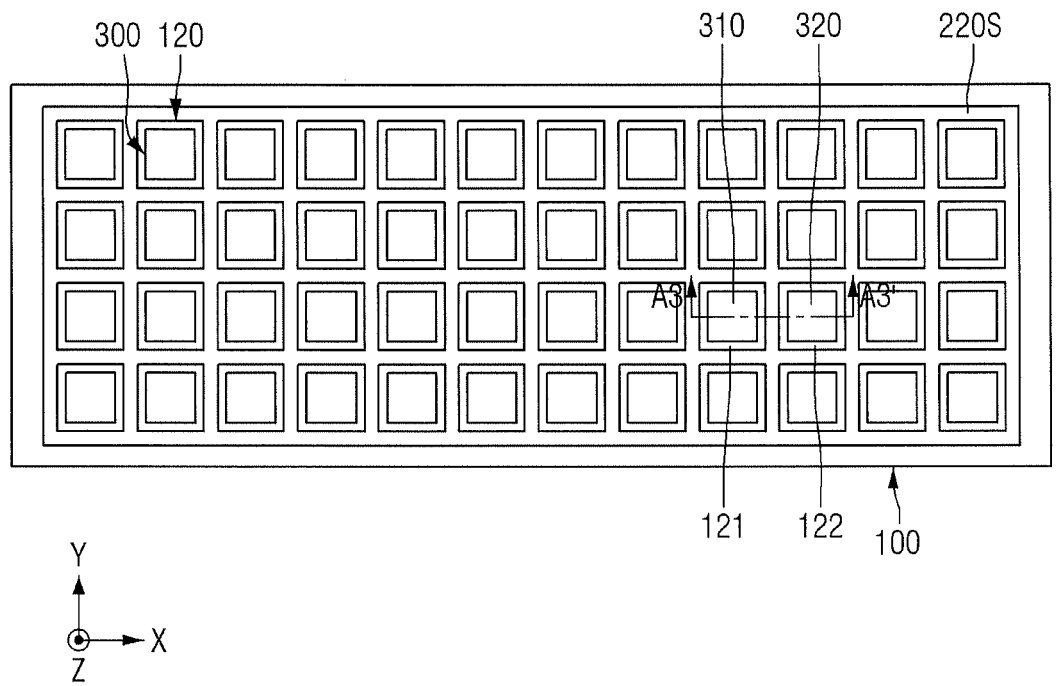
Figure 19:
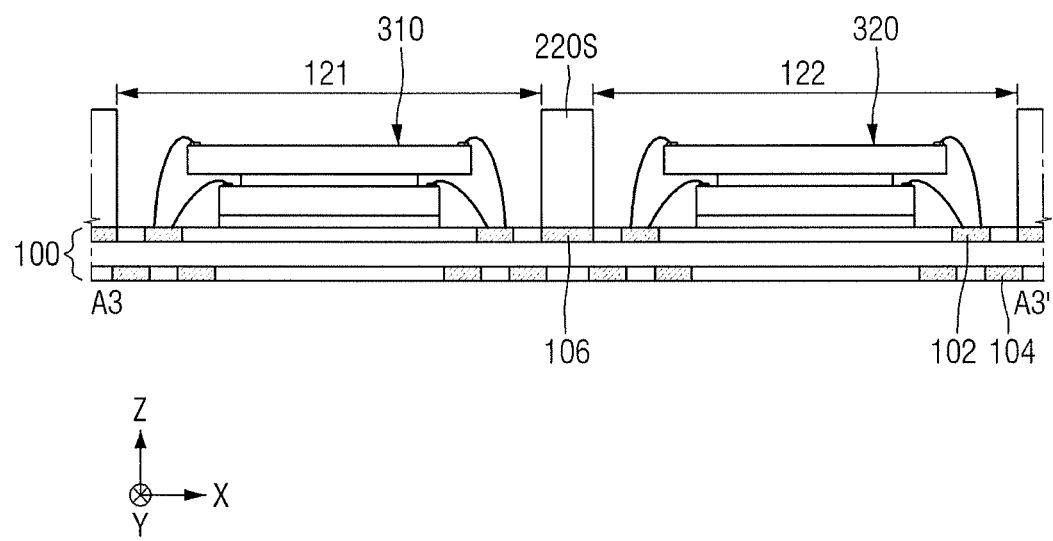

Referring to FIGS. 18 and 19, a plurality of semiconductor chips 300 are formed on the substrate 100. For reference, FIG. 19 is a cross-sectional view taken along the line A3-A3' of FIG. 18.

The semiconductor chips 300 may be formed on the mounting regions 120, respectively. For example, a first semiconductor chip 310 may be formed on the first mounting region 121, and a second semiconductor chip 320 may be formed on the second mounting region 122.

Each of the semiconductor chips 300 may have a structure in which a plurality of chips are stacked. In FIG. 19, each of the first semiconductor chip 310 and the second semiconductor chip 320 has a structure in which only two chips are stacked. However, each of the first semiconductor chip 310 and the second semiconductor chip 320 can have a structure in which three or more chips are stacked.

Since the molding structure 220S can separate at least some of the mounting regions 120, at least some of the semiconductor chips 300 may be separated by the molding structure 220S. For example, the first semiconductor chip 310 and the second semiconductor chip 320 may be separated by the molding structure 220S.

Figure 20:
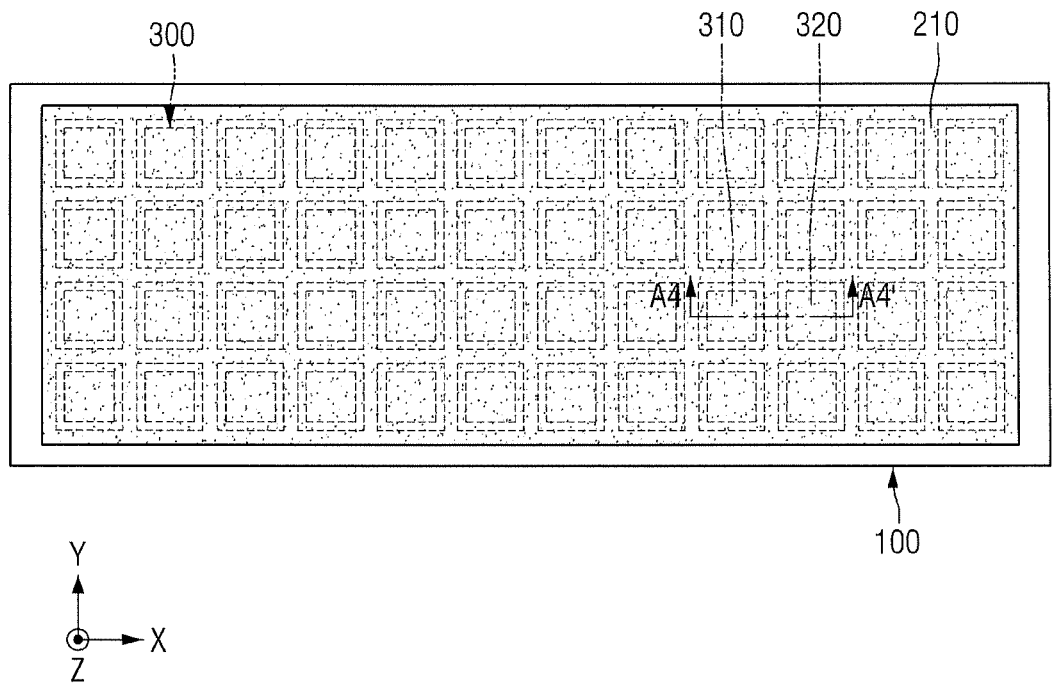
Figure 21:
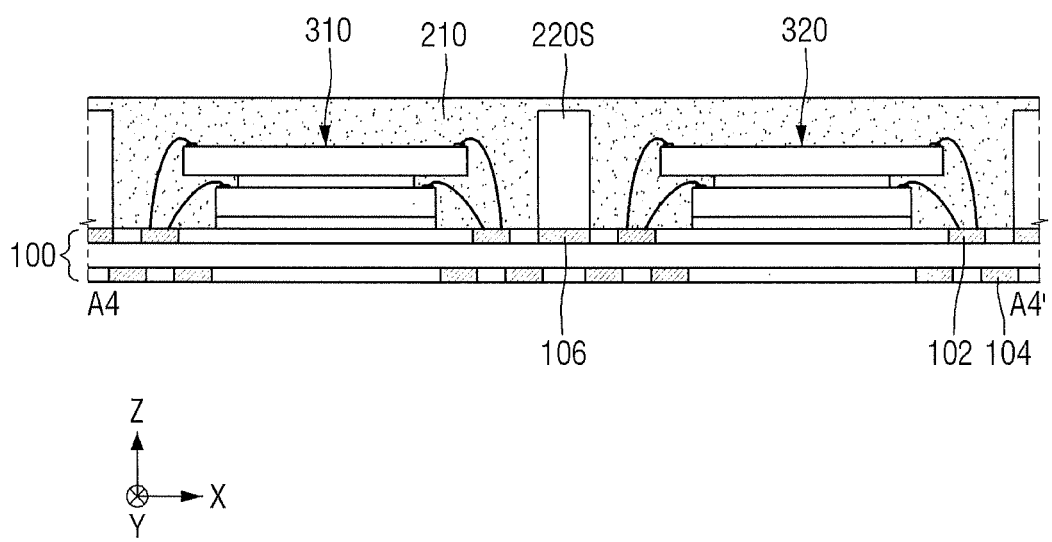

Referring to FIGS. 20 and 21, a first molding portion 210 is formed on the substrate 100 and the molding structure 220S. For reference, FIG. 21 is a cross-sectional view taken along the line A4-A4' of FIG. 20.

The first molding portion 210 may be formed to cover the semiconductor chips 300. For example, the first molding portion 210 may be formed to cover the first semiconductor chip 310 and the second semiconductor chip 320.

In addition, the first molding portion 210 may be formed to cover the molding structure 220S. Accordingly, an uppermost surface of the first molding portion 210 may be higher than an uppermost surface of the molding structure 220S.

The first molding portion 210 may include, for example, a nonconductive EMC. The first molding portion 210 may be formed by at least one of, for example, dispensing, film attach, transfer molding, and compression molding. However, the first molding portion 210 can also be formed by various methods of forming a mold including an EMC.

In some embodiments, the first molding portion 210 may be formed in the same manner as the molding structure 220S. Accordingly, the manufacturing cost of a semiconductor package according to embodiments can be reduced.

Figure 22:
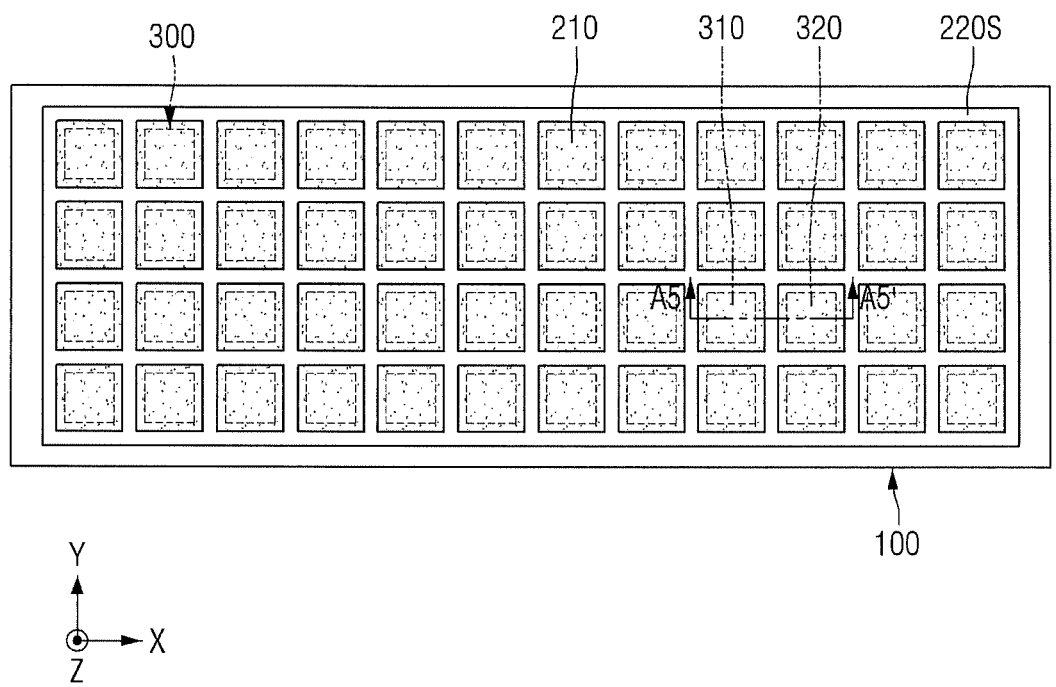
Figure 23:
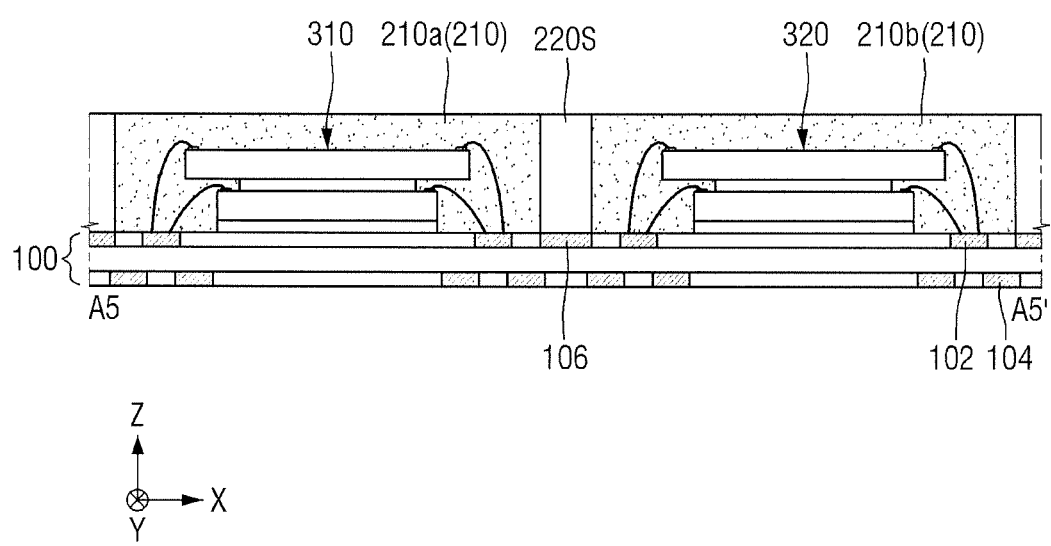

Referring to FIGS. 22 and 23, the upper surface of the molding structure 220S and the upper surface of the first molding portion 210 are planarized. For reference, FIG. 23 is a cross-sectional view taken along the line A5-A5' of FIG. 22.

The upper surface of the molding structure 220S and the upper surface of the first molding portion 210 may be planarized by, for example, chemical mechanical polishing (CMP).

Accordingly, the upper surface of the molding structure 220S and the upper surface of the first molding portion 210 may lie in the same plane. As used herein, the term "same" means not only being completely identical but also having minute differences that may occur due to process margins or the like.

In addition, the first molding portion 210 may be divided into a plurality of encapsulation portions by the molding structure 220S. For example, the first molding portion 210 may include a first encapsulation portion 210a and a second encapsulation portion 210b separated by the molding structure 220S. As illustrated in FIG. 23, the first encapsulation portion 210a may be a portion of the first molding portion 210 which covers the first semiconductor chip 310, and the second encapsulation portion 210b may be a portion of the first molding portion 210 which covers the second semiconductor chip 320.

In some embodiments, the planarizing of the upper surface of the molding structure 220S and the upper surface of the first molding portion 210 may be omitted.

Figure 24:
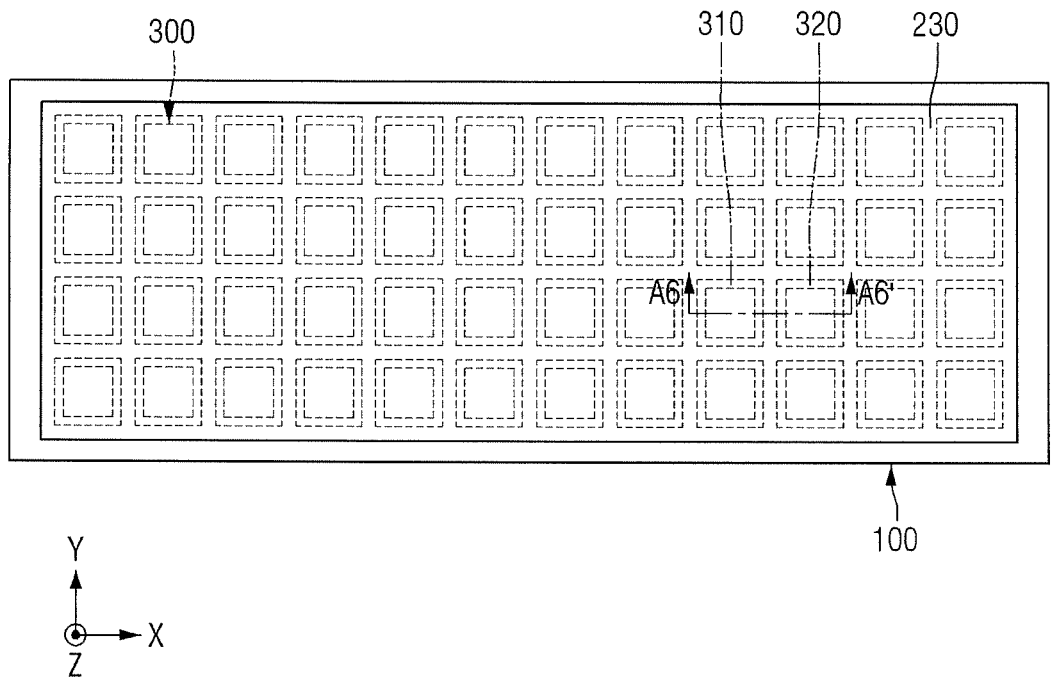
Figure 25:
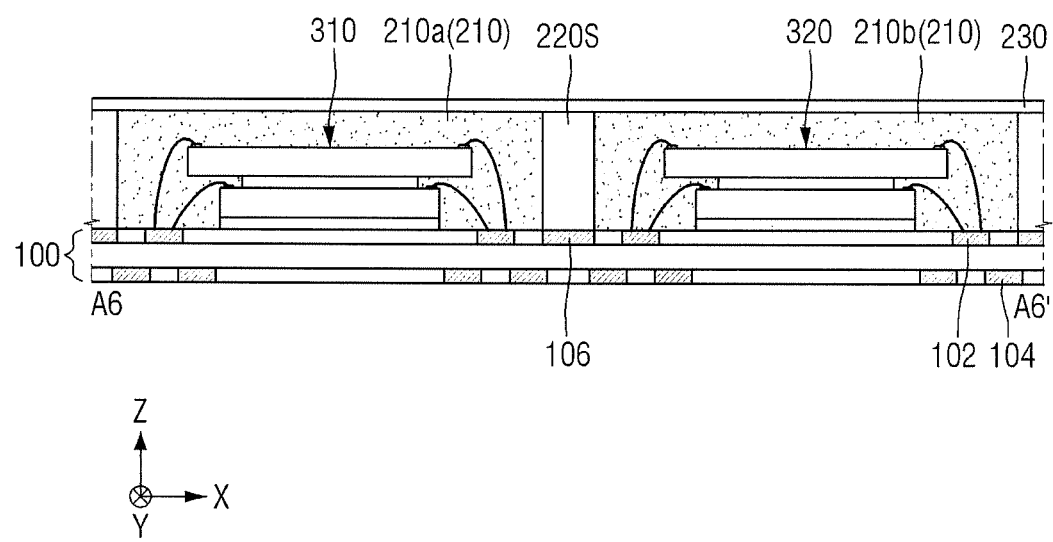

Referring to FIGS. 24 and 25, a third molding portion 230 is formed on the molding structure 220S and the first molding portion 210. For reference, FIG. 25 is a cross-sectional view taken along the line A6-A6' of FIG. 23.

The third molding portion 230 may be formed to cover the upper surface of the molding structure 220S and the upper surface of the first molding portion 210. Accordingly, the third molding portion 230 may contact the molding structure 220S.

In some embodiments, the third molding portion 230 may include a conductive material. For example, the third molding portion 230 may include a conductive EMC.

In some embodiments, however, the forming of the third molding portion 230 on the molding structure 220S and the first molding portion 210 may be omitted.

Therefore, a plurality of semiconductor packages adjacent to each other may be formed using the PCB of FIGS. 1 through 3 or the PCB of FIGS. 4 through 6.

Then, the semiconductor packages adjacent to each other may be cut into individual semiconductor packages.

For example, in a method of fabricating a semiconductor package using the PCB of FIGS. 1 through 3, the semiconductor packages adjacent to each other may be cut around the first semiconductor chip 310 to produce the semiconductor package of FIGS. 7A and 8.

For example, in a method of fabricating a semiconductor package using the PCB of FIGS. 4 through 6, the semiconductor packages adjacent to each other may be cut around the first semiconductor chip 310 to produce the semiconductor package of FIGS. 7C and 8.

For example, the semiconductor packages adjacent to each other may be cut around the first semiconductor chip 310 of FIGS. 24 and 25 to produce the semiconductor package of FIGS. 11 and 12.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed:

1. A semiconductor package comprising:
a substrate;
a semiconductor chip on the substrate;
a first molding portion which covers the semiconductor chip and comprises a first sidewall and a second sidewall opposite each other;
a second molding portion which extends on the substrate along the first sidewall and the second sidewall; and
a third molding portion on the first molding portion and on the second molding portion and comprises a conductive material,
wherein the first molding portion comprises a nonconductive material, and the second molding portion comprises a conductive epoxy molding compound (EMC),
wherein the second molding portion comprises 85 to 95% by weight of a conductive filler based on 100% by weight of the conductive EMC, and
wherein the third molding portion includes a different content of the conductive filler from the second molding portion.

2. The semiconductor package of claim 1, wherein the first molding portion further comprises a third sidewall which connects the first sidewall and the second sidewall, and the second molding portion extends on the substrate along the third sidewall.

3. The semiconductor package of claim 2, wherein the first molding portion further comprises a fourth sidewall opposite the third sidewall, and the second molding portion extends on the substrate along the fourth sidewall.

4. The semiconductor package of claim 1, wherein the substrate comprises a ground pad and the second molding portion electrically contacts the ground pad.

5. The semiconductor package of claim 1, wherein the first molding portion covers an uppermost surface of the second molding portion.

6. The semiconductor package of claim 1, wherein the third molding portion covers an uppermost surface of the first molding portion and an uppermost surface of the second molding portion.

7. The semiconductor package of claim 1, wherein the conductive EMC comprises a conductive material in an amount to provide sufficient electromagnetic interference shielding to an integrated circuit in the semiconductor package.

8. A semiconductor package comprising:
a substrate;
a semiconductor chip on the substrate;
a first molding portion on the substrate and covering the semiconductor chip;
a second molding portion on the substrate and extending along sidewalls of the first molding portion; and
a third molding portion which covers an uppermost surface of the first molding portion and an uppermost surface of the second molding portion,
wherein the second molding portion and the third molding portion comprise a conductive epoxy molding compound (EMC),
wherein each of the second molding portion and the third molding portion comprises 85 to 95% by weight of a conductive filler based on 100% by weight of the conductive EMC, and
wherein the third molding portion includes a different content of the conductive filler from the second molding portion.

9. The semiconductor package of claim 8, wherein the first molding portion has a rectangular parallelepiped shape.

10. The semiconductor package of claim 9, wherein the substrate comprises a ground pad the second molding portion contacts the ground pad, and the third molding portion contacts the second molding portion.

* * * * *